United States Patent [19]

Wistling

[11] Patent Number: 4,807,088

[45] Date of Patent: Feb. 21, 1989

[54] MULTI-POLAR CONTACTORS

[75] Inventor: Roger Wistling, Karlskoga, Sweden

[73] Assignee: Aktiebolaget Bofors, Karlskoga, Sweden

[21] Appl. No.: 54,180

[22] PCT Filed: Oct. 2, 1986

[86] PCT No.: PCT/SE86/00442

§ 371 Date: May 20, 1987

§ 102(e) Date: May 20, 1987

[87] PCT Pub. No.: WO87/02195

PCT Pub. Date: Apr. 9, 1987

[30] Foreign Application Priority Data

Oct. 3, 1985 [SE] Sweden ............................... 8504569

[51] Int. Cl.[4] ............................................... H05K 9/00

[52] U.S. Cl. ..................................... 361/424; 361/413

[58] Field of Search ............... 361/380, 395, 399, 413, 361/415, 424, 428; 439/629, 631

[56] References Cited

U.S. PATENT DOCUMENTS

| | | | |
|---|---|---|---|
| 3,411,130 | 11/1968 | Bushey . | |
| 3,675,083 | 7/1972 | White | 361/413 |
| 4,265,506 | 5/1981 | Hollyday | 439/608 |
| 4,518,209 | 5/1985 | Negley | 439/609 |

FOREIGN PATENT DOCUMENTS

| | | | |
|---|---|---|---|
| 0112019 | 6/1984 | . | |
| 2802643 | 7/1979 | Fed. Rep. of Germany . | |
| 3114223 | 4/1982 | Fed. Rep. of Germany . | |
| 1310684 | 12/1962 | France | 361/413 |
| 2014376 | 8/1979 | United Kingdom . | |

*Primary Examiner*—A. D. Pellinen
*Assistant Examiner*—Gregory D. Thompson
*Attorney, Agent, or Firm*—Pollock, Vande Sande & Priddy

[57] ABSTRACT

A multi-polar contactor device includes a body member with first and second side sections and a partition wall extending between the side sections to define first and second compartments. One of the side sections is removable to expose contactor wafers in one compartment to permit some of the contactor wafers to be removed.

10 Claims, 4 Drawing Sheets

MULTI-POLAR CONTACTORS

BACKGROUND OF THE INVENTION

The present invention relates to a multi-polar contactor device including a structural body member which laterally encloses a contact wafer member disposed in the structural body member. The contactor device includes a first end aperture for connection of the leads, and a second end aperture, by the intermediary of which the contactor may be interconnected with a coupling member which may include another coupling member, connection strip etc.

So-called contactor wafers are already well-established in electrical contact technology. Such a contact wafer consists of a flat unit including a number of parallel-disposed contactor members (plugs, jack plugs) which are baked into/disposed in a body of plastic or the like. A ribbon cable or the like may be connected to the contactor wafer. In such an instance, the contactor wafer is disposed in a structural body which, together with the contactor wafer, forms the contactor device. The latter is interconnected with a corresponding (compatible) connector device, connection strip, etc.

Contactor devices of the above-mentioned types may be employed in coordination with one another, so that it is possible to form a large number of connection points (jack plugs) in a thus formed unit.

SUMMARY OF THE INVENTION

In the prior art, problems are experienced in achieving a number of contact points, which could be satisfied in number, space and mutual location, by contactor devices of current standards. For example, placing two contactor devices of the above-mentioned type adjacent to one another entails that the contactor device density will be relatively small because the walls of the outer structural bodies of adjacent contactor devices reduce available space and so on.

The object of the present invention is to realize a contactor device which solves the above-disclosed and other structural problems. The novel feature of the apparatus according to the invention is that the structural body member is provided with one or more compartments which may each be allocated with a contactor wafer so that two or more contactor wafers may be placed in the body member and together therewith form the contactor device.

According to another feature, one of the side portions of the structural body member is disposed so as to be disconnectable even when the contactor device assumes an interconnected position with the above-mentioned coupling bodies (another contactor device, connection strip, etc.). In the above-described position, at least half of the contactor wafers are disconnectable/connectable from and to, respectively, the coupling members. In one preferred embodiment, the contactor wafers in the compartments are disposed in two parallel adjacent rows, seen in the horizontal section of the contactor device. The contactor wafers which are placed close to the removable side section, will be disposed for disconnection and connection when the side section is removed and the contactor device is interconnected with the coupling member.

The inventive concept as herein disclosed includes contactor devices which enclose contactor wafers with the same and/or a different number of conductors. In the event of a differing number of conductors, the contactor wafers in the compartments of the body member are of different sizes.

The subject matter of the present invention is preferably disposed in compact electronics equipment of the type which is used in, for example, sighting units. The subject matter of the present invention is also highly suited in electronic equipment, which is to be resistant to or insensitive to electromagnetic interference (EMI). In such an instance, the contactor device is cooperable with an outer unit of metal/alloy which encloses the contactor device and coupling member and which acts as a screen against the electromagnetic interference (EMI). This outer unit may be included in another enclosure unit for electronics of the above-mentioned type. The enclosure unit may include an extension along its one longitudinal size. The extension includes a releasable side section, which makes for an access to the releasable side section of the contactor device disposed therein, and the contactor wafers thereof. The extension is provided with screened/pressure overload guarded inputs for connection conductors associated with the above-mentioned wafers.

The present invention makes possible an extremely compact contactor unit in which it is possible to obtain an optimum number of contact points within a given space, despite the fact that no standard components for this purpose are available for the current type of contactor technology.

The possibility of gaining access to the contactor device and removing only that desired contactor wafer, even though there are other contactor wafers in the interconnected state, entails considerable advantages in conjunction with the testing of an/or fault-tracing in the complex electronics contemplated here.

The subject matter of the present invention also makes for a purposeful screening against electromagnetic interference (EMI) which is often a basic requirement for electronic equipment of the type under consideration. As a result of the present invention, it will be possible, within a horizontal section of approximately 15×136 mm, to dispose a contactor device with 160 poles in which it is nevertheless possible to dismantle a certain number of contact functions in the form of contact wafers which interconnect 10 or 20 conductors in integrally united contactors.

BRIEF DESCRIPTION OF THE ACCOMPANYING DRAWINGS

The nature of the present invention and its aspects will be more readily understood from the following brief description of the accompanying drawings referring to one currently preferred embodiment of an apparatus displaying the characteristic features of the present invention and discussion relating thereto.

Figure 3:
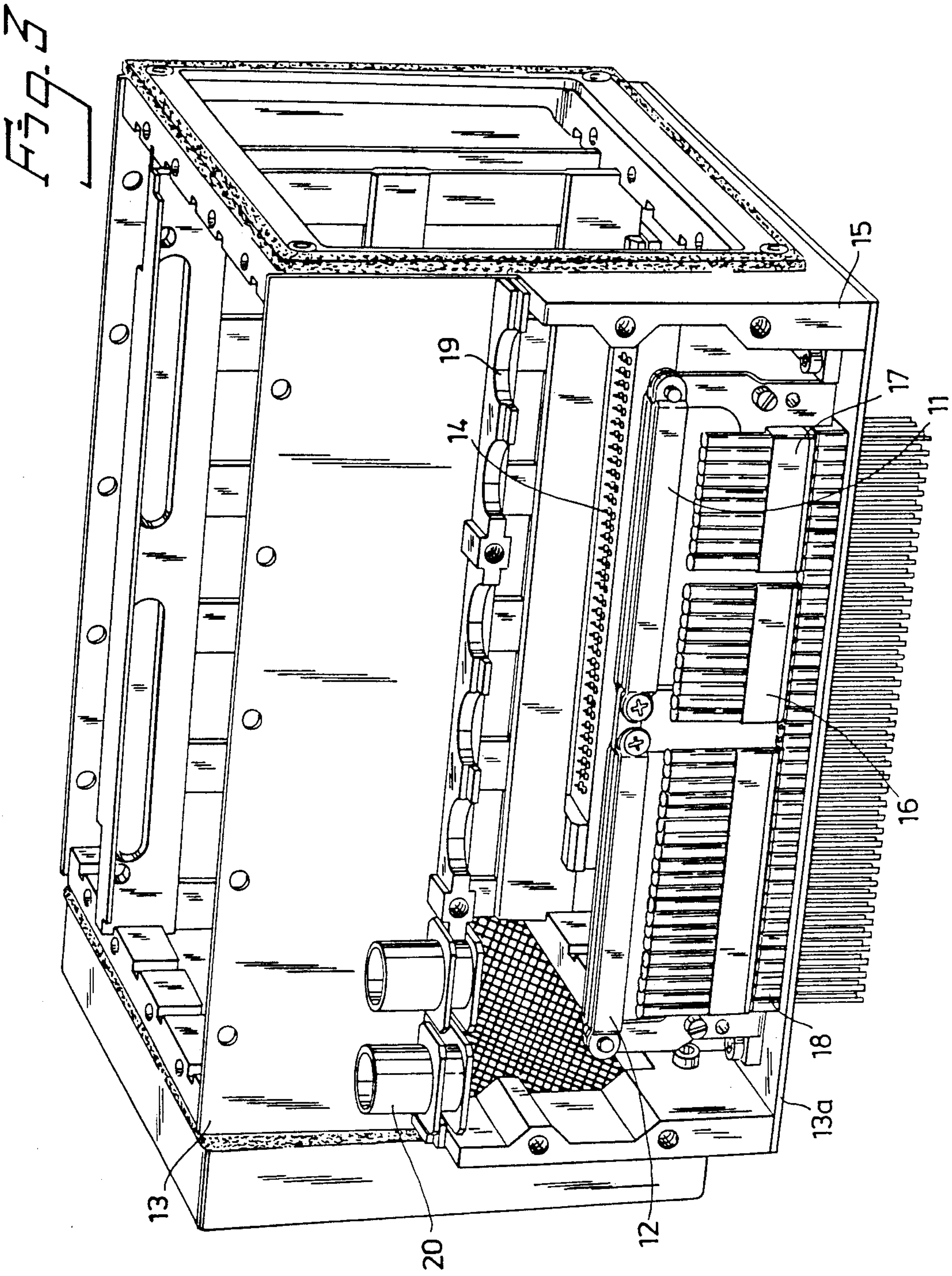
Figure 4:
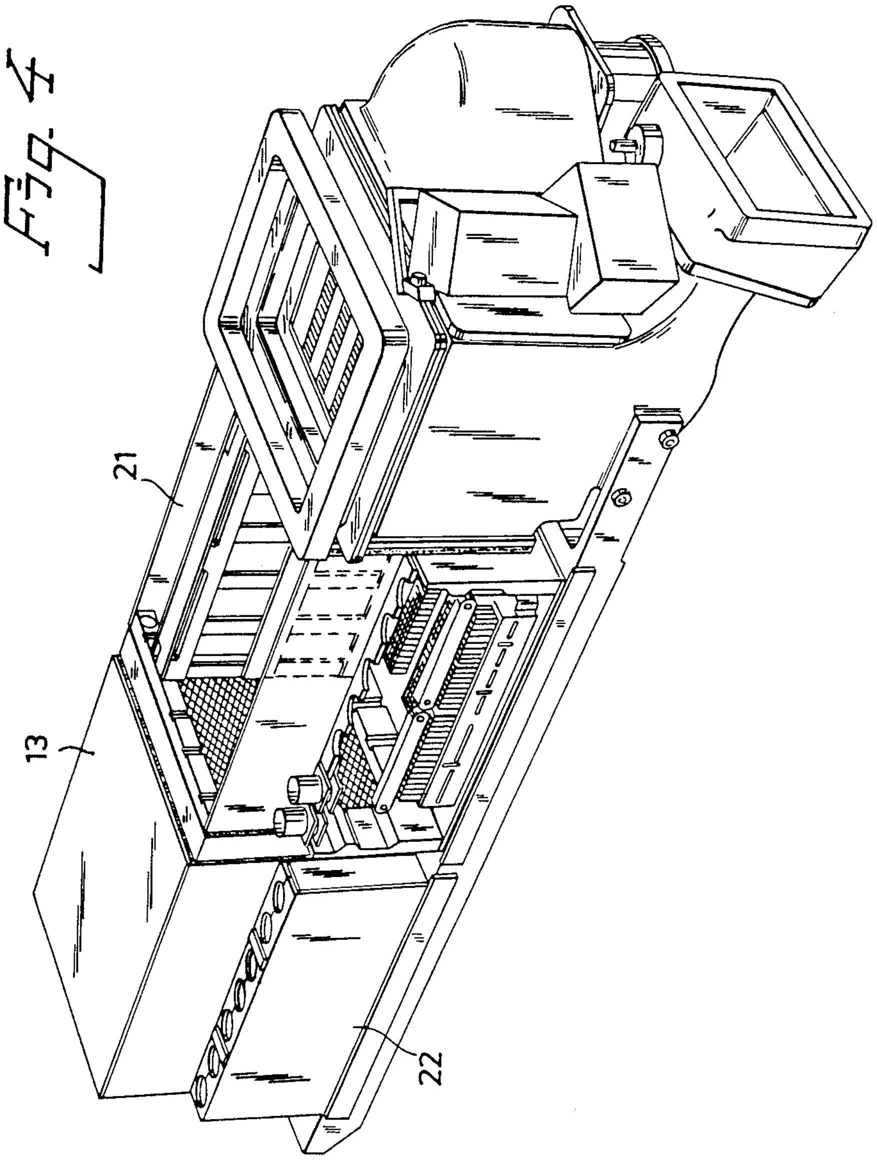

FIG. 3 shows in oblique perspective from above the placement of contactor devices in a unit enclosing electronic equipment and intended for, for example, sighting equipment, a side section of the unit and the side section of the contactor device having been removed; and FIG. 4 shows in oblique perspective above right, the assembly construction of the unit of FIG. 3 together with a further unit in which the side section omitted from FIG. 3 is shown.

DESCRIPTION OF THE PREFERRED EMBODIMENT

Figure 1:
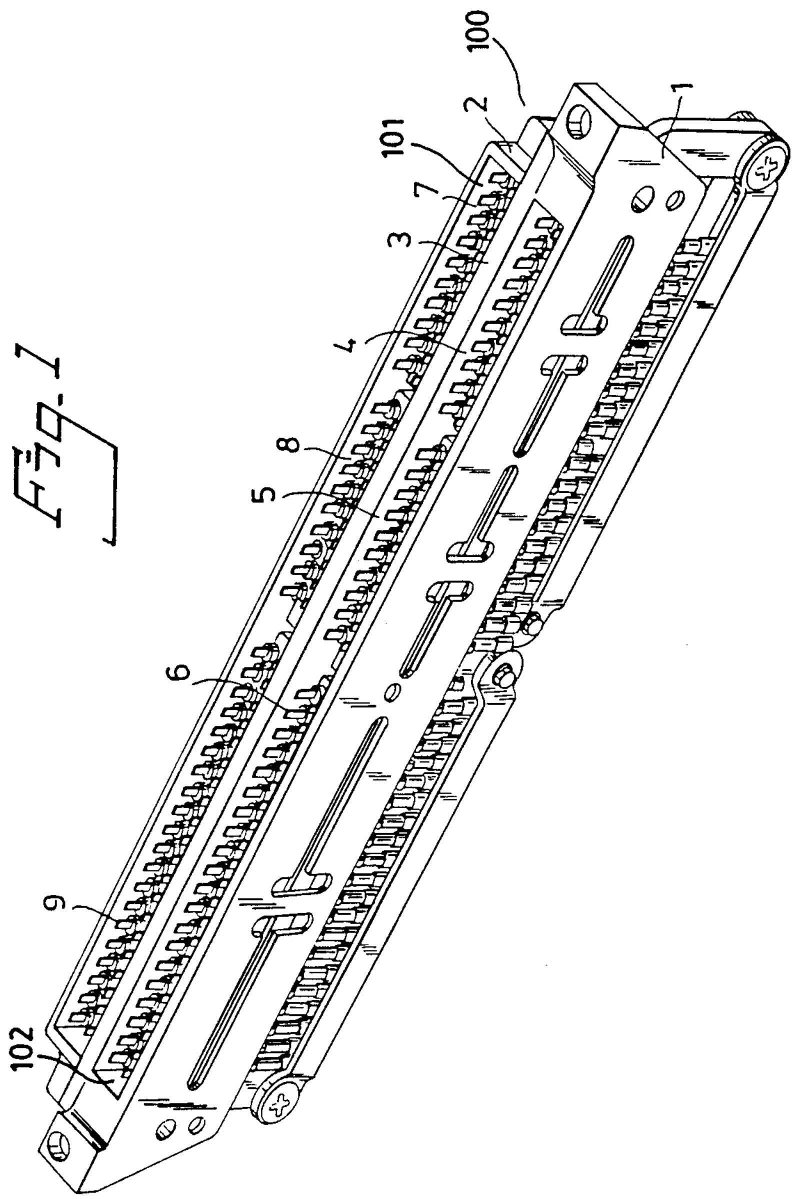
FIG. 1 shows in perspective, obliquely from the right and below, one embodiment of the contactor device according to the present invention, with different compartments for contactor wafers and in which the compartments have been provided with contactor wafers of 20-pin wafer type and with 10-pin wafers.

Referring to the drawings, FIG. 1 illustrates a structural body member 100 including two inter-connectable side section 1 and 2, and central partition 3. The side sections are here, disposed so as to enclose substantially rectangular compartments seen in the horizontal section of the body member. These substantially rectangular inner compartments 101, 102, in its turn, provide space divided into multi-space zones for receiving multiple contact wafers which each in their turn are substantially rectangular (seen in the horizontal section of the body). In the illustrated embodiment, these space zones may be considered as forming two mutually adjacently recumbent rows which are separated by a central partition 3 which extends substantially in parallel with the side sections 1, 2.

Thus, the forward row displays space zones with contactor wafers 4 and 5 and a contactor wafer 6. The outer row, according to the figure, correspondingly displays space zones with contactor wafers 7 and 8 and a contactor wafer 9. The different contactor wafers are elongate and oblong in the cross-section of the body member 100.

The contactor wafers may be of known type as sold on the open market, for example a contacter wafer of the Raychen make. Since the design of the contactor wafer is previously known in this art, it will not be described in greater detail here, it being merely ascertained that the contact wafer displays, at its ends, contactor means and connection members for a ribbon cable or the like (not shown).

Figure 2:
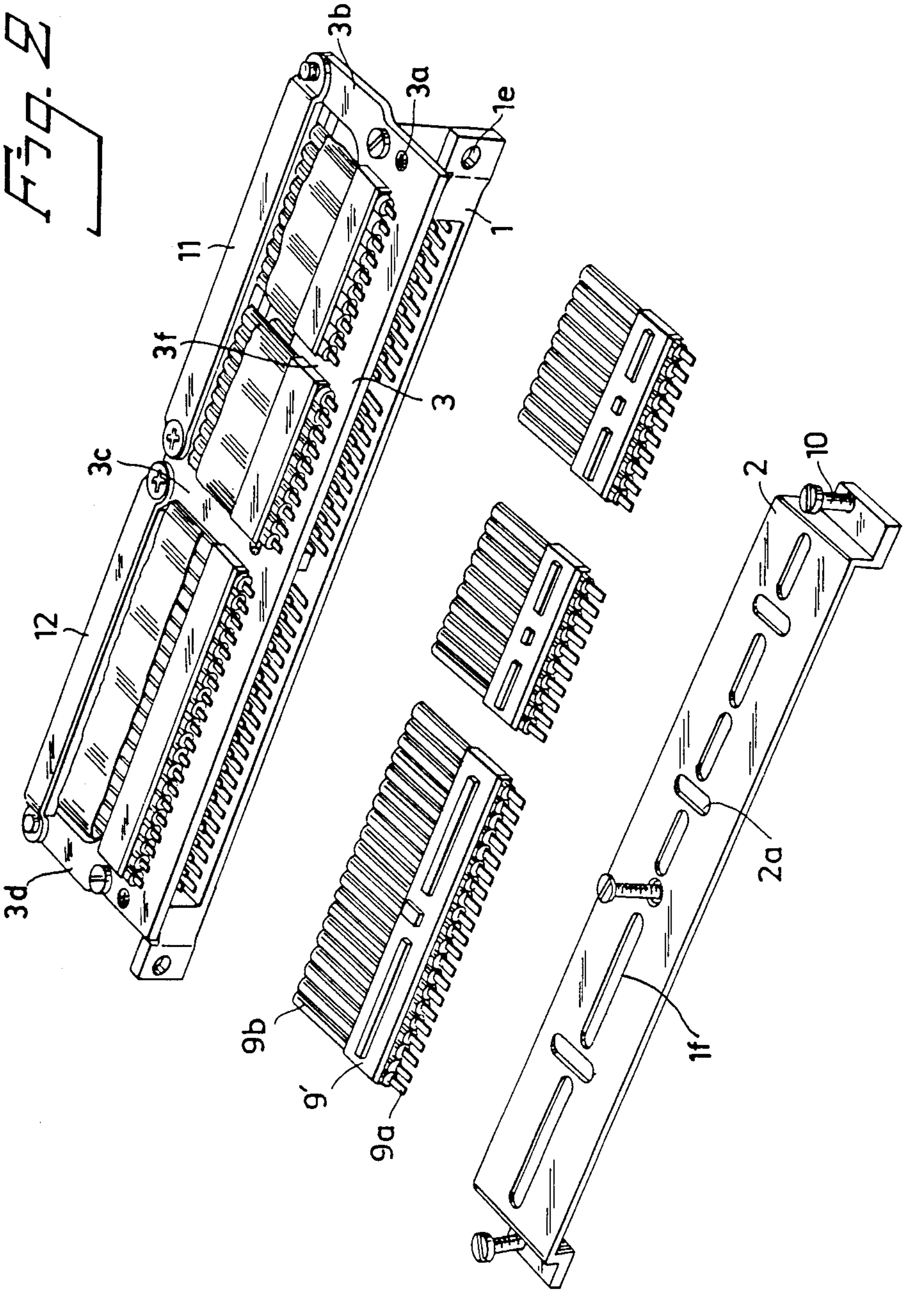
FIG. 2 shows different disconnected parts of the contactor device of FIG. 1.

The side section 2 is releasably disposed on the side section 1. FIG. 2 shows an example of such a releasable disposition. The side section 2 can be fixedly mounted in place by fixing means 10, for example in the form of screws which are provided to be threaded into corresponding holes 3*a* in the side section 1. In FIG. 2, the side section 2 has been removed. The contactor wafer 9 remains in its position in the side section 1. In order to illustrate more closely the appearance of the contactor wafer, a contactor wafer 9′ which corresponds to the contactor wafer 9 has been placed between the side parts 1 and 2 in FIG. 2. On the contactor wafer 9′, the contactor device has been designated 9*a* and the connection member 9*b*.

The partition 3 has also been extended on both sides and displays anchorages 3*b*, 3*c* and 3*d* for mechanical clamping members 11 and 12 for relieving the load which may be placed on a connected ribbon cable. Such a load-relieving function is known in the art.

The body member 100 formed by the side sections 1 and 2 and wall 3 define compartments 101, 102 providing space zones for different sizes of contactor wafers. This is apparent from FIG. 1 which shows that the space zones for the contactor wafers 6 and 9 are larger than those for contactor wafers 4, 5 and 7, 8, respectively. In the illustrated embodiment, the contactor wafer 6 and 9 are for 20-pin conductors, while the contactor wafers 4, 5, 7, 8 mounted in corresponding space zones are for 10-pin conductors.

The sections 1 and 2 and anchorages 3*b*, 3*c*, and 3*d* are made of metal. The clamping members 11 and 12 include metal strips in which rubber coatings are fixedly disposed. The walls of the side sections 1 and 2 and the intermediate portion 3 are relatively thin and may assume values of between 0.1 and 0.3 mm. At the end surface of the body portion, the side section 1 is provided with anchorage holes 1*e*. The side sections 1 and 2 also include anchorage members 1*f* and 2*a*, respectively, which enter into cooperation with corresponding devices on the contactor wafer such that when the side sections are screwed together, each respective contactor wafer is fixed in its position in the thus formed contactor device of FIG. 1.

FIG. 3 illustrates the contactor device, according to the above disclosure, built into a unit 13, which enclosed advanced electronic equipment, this, however, not being shown in the figure. In the bottom of the unit 13, there is provided a number of coupling members 14 extending in parallel for assembly boards which are stackably upright and which carry components such as capacitors, resistors, chips, etc. At its one longitudinal side, the unit 13 also includes an extension 15 in which the above-mentioned contactor device may be disposed. In FIG. 3, one side section of the extension has been removed, which also applied to the side section of the contactor device (the side section 2 in FIG. 2). In this Figure, the contactor wafers corresponding to 4, 5 according to FIG. 1 are designated as 16 and 17. By the intermediary of the coupling members (9*a* according to FIG. 2) of the contactor wafers, the contactor device is inserted in corresponding contactor means in a connection strip 18 which extends into the extension section. The connections strip 18 is substantially parallel with the coupling members 14. The connecting strip 18 is disposed on the base plate 13*a* of the unit 13. The contactor devices serve as outer connection members to the components on the upright stacked assembly boards (not shown in detail) and their components. On the underside of the unit 13, connection pins project at points where the mutual inter-connection between the components on the different boards is effected.

The conductive outer connection to the contactor device (not shown) is effected by the intermediary of recesses on the upper side of the extension 15. Half of one such a recess is designated 19 on the drawing. In one of the previously mentioned recesses, there is disposed a sleeve 20 of a known type. One such sleeve is disposed in each one of the recesses 19 of the extension section. Hence, there should be a total of seven sleeves in the case illustrated in FIG. 3.

In FIG. 3, with the side section 2 removed, the contactor wafers 16, 17 and 18 may be removed together or individually, even though remaining contactor wafers are in place in the inter-connected state with the connection strip 18. Naturally, the mechanical load bearing provision 11 and 12, respectively, must first be dismantled before such removal can be effected. Similarly, an already removed contactor wafer may be returned to its position according to FIG. 3. This individual disconnection/connection facility is of considerable importance in testing, service, fault-tracing and the like.

FIG. 4 is intended to illustrate the case in which the unit 13 is included in or disposed with a similar unit 21. For example, the units 13 and 21 may be included in sighting equipment, where severe demands are placed on the environment of the electronics themselves, for example from the points of view of cleanliness, freedom from disturbance, etc. The side portion 22 of the extension section 15 in FIG. 3 is fixedly mounted on the unit 21, showing how the circular lead-ins for outer connection are formed. The units 13 and 21, like their extension section 15 and side portion 22, are of metal/alloy. The sleeves 20 according to FIG. 3 are of brass. The cables (not shown) led in through these sleeves are carefully screened in the sleeves 20. Moreover, the units 13 and 21 are carefully sealed and tight. This entails that a reliable sealing of the electric contacts is realized from the point of view of disturbance, with the result that the electric contact functions are reliably screened-off and guarded against electromagnetic impulses (EMI). Moreover, the enclosure will be superiorly sealed against dust and the external environment.

According to the illustrated embodiment, the contactor wafers which are disposed between the side section 1 and its associated central partition wall 3 are non-removably anchored. On the other hand, the contactor wafers between the side section 2 and the intermediate partition 3 are removably anchored and may be removed when the side section 2 is dismounted. On anchorage of the side section 2 in the side section 1, there will simultaneously be obtained anchorage of the contactor wafers in the thus formed device.

The present invention should not be considered as restricted to the embodiment disclosed above by way of example, and shown on the drawings, many modifications being conceivable without departing from the spirit and scope of the appended claims. For example, the intermediate partition 3 and remaining contactor wafers may be rendered individually removable.

I claim:

1. A multipolar contactor device comprising:

a body member including first and second side sections and a partition wall extending therebetween;

a first compartment defined between said first side section and said partition wall;

a second compartment defined between said second side section and said partition wall;

said first or second compartments providing spaces for contactor wafers;

a plurality of adjacent contactor wafers disposed in said spaces in said compartments, said contactor wafers being interconnectable at one end with individual conductors and at a second end interconnectable with a coupling member; and at least one of said side sections being removably connected to said body member, such as to be detachable when said contactor wafers are coupled with said coupling member, thereby exposing said contactor wafers in one compartment while permitting one or more of said contactor wafers to remain connected to said coupling member.

2. The contactor device according to claim 1, wherein said contactor wafers are disposed in said compartments in two parallel, adjacent rows.

3. The contactor device as claimed in claim 2, wherein said contactor wafers are designed for the same number of conductors.

4. The contactor device as claimed in claim 2 further comprising a first outer unit for housing electronic equipment, said unit being made of metal/alloy and enclosing said contactor device and the coupling member such that electric contact functions of the contactor device and the coupling member are screened from electromagnetic impulses (EMI) and contamination.

5. The contactor device as claimed in claim 4, wherein the first outer unit is disposed adjacent a second outer unit for housing electronic sighting equipment.

6. The contactor device as claimed in claim 1, wherein said contactor device cooperates with the coupling member at a base plate of a first outer unit housing electronic equipment, said base plate supporting the coupling member, said outer unit including an extension member at its one side; and wherein said extension member includes a side section which is removably disposed for access to said at least one removable side section of said body member and contactor wafers.

7. The contactor device as claimed in claim 6, wherein said extension member, on its upper side, is provided with at least one lead-in recess for shielded connection of conductors associated with said contactor wafers.

8. The contactor device as claimed in claim 1, wherein said partition wall is being provided with extending anchorage means for mechanical load-alleviation of connected outer cables.

9. The contactor device as claimed in claim 8, wherein said removable side section is provided with fixing means which in the interconnected state of said side sections positionally fix contactor wafers disposed in said compartments between said removable side section and said partition wall.

10. The contactor device as claimed in claim 1, wherein the contact wafers have a different number of conductors.

* * * * *